(12) United States Patent
Park et al.

(10) Patent No.: US 7,885,107 B2
(45) Date of Patent: Feb. 8, 2011

(54) METHODS OF PROGRAMMING NON-VOLATILE MEMORY CELLS

(75) Inventors: Ju-hee Park, Guri-si (KR);
Young-moon Kim, Yongin-si (KR);
Yoon-dong Park, Yongin-si (KR);
Seung-hoon Lee, Seoul (KR);
Kyoung-lae Cho, Yongin-si (KR);
Sung-jae Byun, Yongin-si (KR);
Seung-hwan Song, Incheon (KR)

(73) Assignee: Samsung Electronics Co, Ltd., Gyeonggi-do (KR)

( * ) Notice: Subject to any disclaimer, the term of this patent is extended or adjusted under 35 U.S.C. 154(b) by 153 days.

(21) Appl. No.: 12/219,663

(22) Filed: Jul. 25, 2008

(65) Prior Publication Data

US 2009/0091974 A1    Apr. 9, 2009

(30) Foreign Application Priority Data

Oct. 8, 2007    (KR) .................. 10-2007-0100889

(51) Int. Cl.
*G11C 11/34* (2006.01)
*G11C 16/04* (2006.01)
(52) U.S. Cl. .................... 365/185.03; 365/185.22; 365/185.24
(58) Field of Classification Search ............ 365/185.03, 365/185.22, 185.24
See application file for complete search history.

(56) References Cited

U.S. PATENT DOCUMENTS

| | | | | |
|---|---|---|---|---|
| 5,602,789 | A * | 2/1997 | Endoh et al. | 365/185.03 |
| 6,219,276 | B1 * | 4/2001 | Parker | 365/185.03 |
| 6,643,177 | B1 * | 11/2003 | Le et al. | 365/185.2 |
| 7,023,737 | B1 | 4/2006 | Wan et al. | |
| 7,215,575 | B2 * | 5/2007 | Chen et al. | 365/185.22 |
| 7,649,784 | B2 * | 1/2010 | Cho et al. | 365/185.24 |
| 2004/0080979 | A1 | 4/2004 | Park | |
| 2007/0177434 | A1 | 8/2007 | Mo et al. | |
| 2008/0165579 | A1 * | 7/2008 | Lee | 365/185.03 |

OTHER PUBLICATIONS

European Search Report and Written Opinion dated Feb. 26, 2009 for corresponding European Application No. 08164640.8.

* cited by examiner

*Primary Examiner*—Anh Phung
(74) *Attorney, Agent, or Firm*—Harness, Dickey & Pierce

(57) ABSTRACT

A method of programming a non-volatile memory cell includes programming a first bit of multi-bit data by setting a threshold voltage of the non-volatile memory cell to a first voltage level within a first of a plurality of threshold voltage distributions. A second bit of the multi-bit data is programmed by setting the threshold voltage to a second voltage level based on a value of the second bit. The second voltage level is the same as the first voltage level if the second bit is a first value and the second voltage level is within a second of the plurality of threshold voltage distributions if the second bit is a second value. A third bit of the multi-bit data is programmed by setting the threshold voltage to a third voltage level based on a value of the third bit.

20 Claims, 11 Drawing Sheets

|  | D1 | D2 | D3 | D4 | D5 | D6 | D7 | D8 |
|---|---|---|---|---|---|---|---|---|
| 3rd bit | 1 | 1 | 1 | 1 | 0 | 0 | 0 | 0 |
| 2nd bit | 1 | 1 | 0 | 0 | 1 | 1 | 0 | 0 |
| 1st bit | 1 | 0 | 0 | 1 | 1 | 0 | 0 | 1 |

|  | D1 | D2 | D3 | D4 | D5 | D6 | D7 | D8 |
|---|---|---|---|---|---|---|---|---|
| 3rd bit | 1 | 1 | 1 | 1 | 0 | 0 | 0 | 0 |
| 2nd bit | 1 | 1 | 0 | 0 | 0 | 0 | 1 | 1 |
| 1st bit | 1 | 0 | 0 | 1 | 1 | 0 | 0 | 1 |

METHODS OF PROGRAMMING NON-VOLATILE MEMORY CELLS

PRIORITY STATEMENT

This non-provisional U.S. patent application claims priority under 35 U.S.C. §119 to Korean Patent Application No. 10-2007-0100889, filed on Oct. 8, 2007, in the Korean Intellectual Property Office, the entire contents of which is incorporated herein by reference.

BACKGROUND

Description of the Related Art

A conventional non-volatile memory device capable of erasing and programming data, for example, a flash memory, may preserve data when power is not supplied to the non-volatile memory device.

A conventional flash memory may be formed from memory cells, which may include a cell transistor having a control gate, a floating gate, a source, and a drain. The cell transistor of the flash memory may be programmed or erased by an F-N tunneling mechanism.

An erasing operation of the cell transistor may be performed by applying a ground voltage to the control gate, and then applying a voltage higher than a power supply voltage to a semiconductor substrate, a bulk or the like. An electric field may form between the floating gate and the bulk due to a voltage difference. As a result, electrons in the floating gate may be emitted to the bulk by an F-N tunneling effect, thereby decreasing a threshold voltage of the erased cell transistor.

A programming operation of the cell transistor may be performed by applying a voltage higher than the power supply voltage to the control gate, and then applying the ground voltage to the drain and the bulk. Electrons may be supplied to the floating gate of the cell transistor, thereby increasing a threshold voltage of the programmed cell transistor.

A state where the electrons are injected to the floating gate may be called a program state and a state where the electrons are removed from the floating gate may be called an erase state. The threshold voltage of the program state may be larger than 0, and the threshold voltage of the erase state may be smaller than 0.

A conventional multi-level flash memory that stores multiple bits of data in one memory cell may increase the integrity of the flash memory. A memory cell storing multiple bits may be referred to as a multi-level cell and a memory cell storing a single-bit may be referred to as a single-level cell. In order to store multiple bits, a threshold voltage of the multi-level cell may have a voltage level within one of at least four threshold voltage distributions. In this example, each threshold voltage distribution has a corresponding data storing state, and thus one multi-level cell may have at least four data storing states.

SUMMARY

Example embodiments relate to non-volatile multi-level memory cells and methods of programming non-volatile multi-level memory cells.

Example embodiments provide methods of programming a non-volatile memory cell, where multi-bit data of at least n bits may be programmed by using an m-bit programming process. In one example, m may be 2 and n may be 3.

At least one example embodiment provides a method of programming a non-volatile memory cell (including, for example, first, second and third operations). The first and second operations may program a threshold voltage of the non-volatile memory cell based on the values of first and second bits of data to be programmed. Based on the values of the first and second bits of data, a threshold voltage may be programmed to a voltage level within one of first, second, third or fourth threshold voltage distributions. The third operation may maintain the threshold voltage based on the values of first and second bits or program the threshold voltage to a voltage level within one of fifth, sixth, seventh or eighth threshold voltage distributions. The third operation may program the threshold voltage based on a value of a third bit of the data. Fourth and fifth operations may be used in addition to the first, second and third operations. The fourth and fifth operations may program the threshold voltage based on the values of the first and second bits, to a voltage level within one of the fifth through eighth voltage distributions. An initial threshold value may be used in the fourth and fifth operations and may be a voltage level within the fifth threshold voltage distribution.

According to at least some example embodiments, one of a first plurality of threshold voltage distributions containing the threshold voltage after the fourth and fifth operations may correspond to one of a second plurality of threshold voltage distributions containing the threshold voltage after the first and second operations.

At least one other example embodiment provides a method of programming a non-volatile memory cell. The method may include programming a first bit of multi-bit data by setting a threshold voltage of the non-volatile memory cell to a first voltage level. The first voltage level may be within a first of a plurality of threshold voltage distributions. A second bit of the multi-bit data may be programmed by setting the threshold voltage to a second voltage level based on a value of the second bit. The second voltage level may be the same as the first voltage level if the second bit is a first value. The second voltage level may be within a second of the plurality of threshold voltage distributions if the second bit is a second value. A third bit of the multi-bit data may be programmed by setting the threshold voltage to a third voltage level based on a value of the third bit.

According to at least some example embodiments, the first and second bits may be re-programmed if the third bit is the second value. The first bit may be re-programmed by setting the threshold voltage to a fourth voltage level based on the value of the first bit. The second bit may be re-programmed by setting the threshold voltage to a fifth voltage level based on the value of the second bit.

At least one other example embodiment, provides a method of mapping a plurality of multi-bit codes to a plurality of threshold voltage distributions for programming a memory cell. The method may include first mapping each of a first plurality of multi-bit codes to a corresponding threshold voltage distribution in a first plurality of threshold voltage distributions. The first plurality of multi-bit codes may include at least first through fourth codes and the first plurality of threshold voltage distributions may include at least first through fourth threshold voltage distributions. Each of a second plurality of multi-bit codes may be mapped to a corresponding threshold voltage distribution in a second plurality of threshold voltage distributions. The second plurality of multi-bit codes may include at least fifth through eighth codes and the second plurality of threshold voltage distributions may include at least fifth through eighth threshold voltage distributions. Each of the first through fourth multi-bit codes may have first and second bits that are the same as the first and second bits of a corresponding fifth through eighth multi-bit code. A third bit of each of the first through fourth multi-bit codes may be different from a third bit of the corresponding fifth through eighth multi-bit code.

BRIEF DESCRIPTION OF THE DRAWINGS

Example embodiments will become more apparent by describing in detail the example embodiments shown in the attached drawings in which.

DETAILED DESCRIPTION OF EXAMPLE EMBODIMENTS

Figures 1A, 1B:
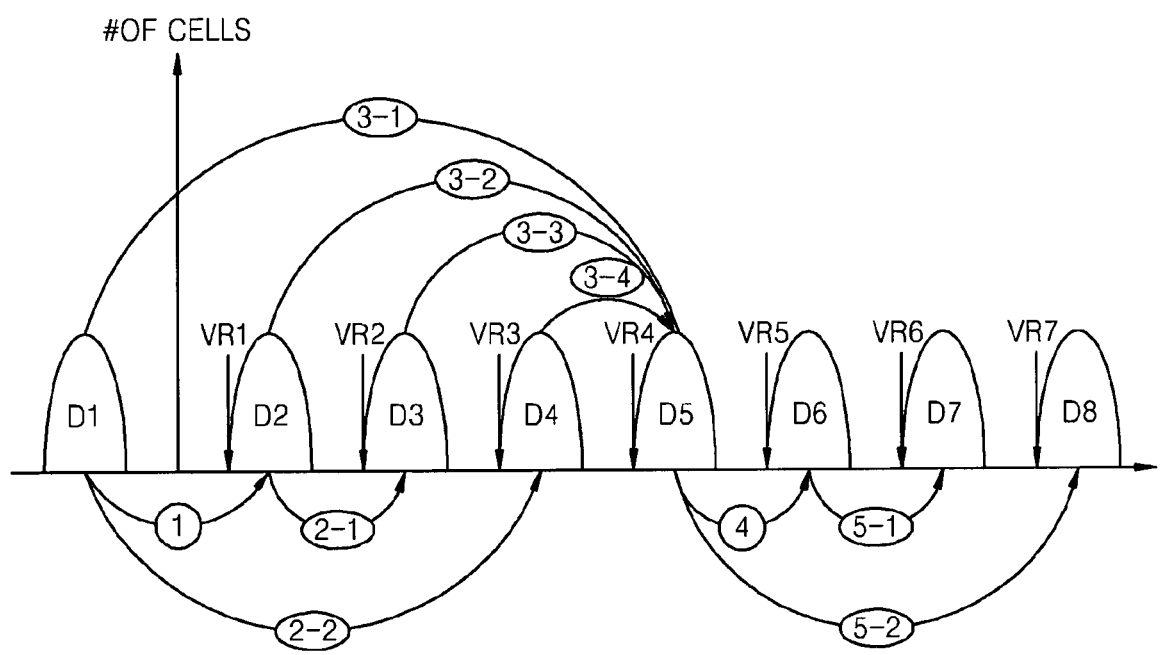
FIG. 1A is a diagram of a method of programming a non-volatile memory cell according to an example embodiment.
FIG. 1B is a chart illustrating example codes used for programming a non-volatile memory cell according to an example embodiment.

Various example embodiments will now be described more fully with reference to the accompanying drawings in which some example embodiments are shown.

Detailed illustrative example embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Example embodiments of methods of programming non-volatile memory cells will now be described more fully with reference to the attached drawings.

According to at least some example embodiments, data of n bits may be programmed in a non-volatile memory cell using an m-bit programming process. Each of n and m may be integers, and the number n may be greater than m. In addition, the number n may be odd, and the number m may be even. It should be noted, for purposes of clarity and brevity, some example embodiments describe a process where n equals 3 and m equals 2. However, n is not limited to 3 and m is not limited to 2.

In a method of programming multi-bit data in a non-volatile memory cell according to an example embodiment, a first bit of the multi-bit data may be programmed by setting the threshold voltage of the non-volatile memory cell to a first voltage level. The first voltage level may be within a first threshold voltage distribution. A second bit of the multi-bit data may be programmed by setting the threshold voltage to a second voltage level, the second voltage level may be within the first threshold voltage distribution or within a second threshold voltage distribution based on the value of the second bit. A third bit may be programmed by setting the threshold voltage to a third voltage level. The third voltage level may be determined based on the value of the third bit.

FIG. 1A is a diagram illustrating a method of programming a non-volatile memory cell according to an example embodiment. FIG. 1B is a chart illustrating example codes used for programming a non-volatile memory cell according to an example embodiment.

Referring to FIGS. 1A and 1B, first through eighth threshold voltage distributions D1 through D8 of the non-volatile memory cell may be mapped to codes 111, 110, 100, 101, 011, 010, 000, and 001, respectively. Depending on which code is written, a threshold voltage of the non-volatile memory cell may be programmed or set to a voltage level within the threshold voltage distribution that corresponds to the written code. Although discussed as being within the threshold distribution, the threshold voltage may also be equal or substantially equal to the outer boundaries of the corresponding threshold voltage distribution. First through eighth threshold voltage distributions may be divided into first and second pluralities of threshold voltage distributions. The first plurality of threshold voltage distributions may include at least first, second, third and fourth threshold voltage distributions, while the second plurality of threshold voltage distributions may include at least fifth, sixth, seventh and eighth threshold voltage distributions.

Each of the first through fourth codes may include a first, second and third bit (as shown in FIG. 1B, for example). As discussed herein, the first bit refers to the right-most bit, the second bit refers to the middle-bit and the third bit refers to the left-most bit. The first through fourth codes may correspond to first through fourth threshold voltage distributions D1 through D4, respectively. The fifth through eighth codes may correspond to the fifth through eighth threshold voltage distributions D5 through D8, respectively. Each first bit and second bit of the first through fourth codes may correspond to—or have the same value as—a first bit and a second bit of fifth through eighth codes. For example, the first bit and second bit of the first code (e.g., '111' corresponding to threshold voltage D1 in FIG. 1B) may be 1, and the first bit and second bit of the fifth code (e.g., '011' corresponding to threshold voltage D5 in FIG. 1B) may also be 1.

In the same manner, the first and second bits of the second and the sixth codes may have the same value, the first and second bits of the third and the seventh codes may have the same value, and the first and second bits of the fourth and the eighth codes may have the same value.

Furthermore, third bits of the first through fourth codes may be different from the third bits of the fifth through eighth codes. For example, the third bit of each of the first through fourth codes may be 1, whereas the third bit of each of the fifth through eighth codes may be 0.

As shown in FIG. 1A, the first through third bits of data may be programmed using first through fifth operations 1 through 5-2 in FIG. 1A.

Referring to FIG. 1A, a first operation 1 may program the first bit of data using the first and second threshold voltage distributions D1 and D2. The second operation 2-1 and 2-2 may program the second bit of data using the first through fourth threshold voltage distributions D1 through D4. The third operation 3-1, 3-2, 3-3, and 3-4 may program the third bit of data using the first through fifth threshold voltage distributions D1 through D5. The fourth operation 4 may program (or re-program) the first bit of the data by using the fifth and sixth threshold voltage distributions D5 and D6. The fifth operation 5-1 and 5-2 may program (or re-program) the second bit of the data by using the fifth through eighth threshold voltage distributions D5 through D8. These programming operations will be discussed in more detail below.

The first and fourth operations 1 and 4 may be similar or substantially similar, and the second and fifth operations 2-1 and 2-2, and 5-1 and 5-2 may be similar or substantially similar. Accordingly, an example embodiment illustrated in FIG. 1A, for example, may program data of at least 3 bits using a 2-bit programming process. Accordingly, a complex programming process may not be required in order to program the data of at least 3 bits.

The first through fifth operations 1 through 5-2 will now be described in detail with reference to FIGS. 2 through 9.

Figure 2:
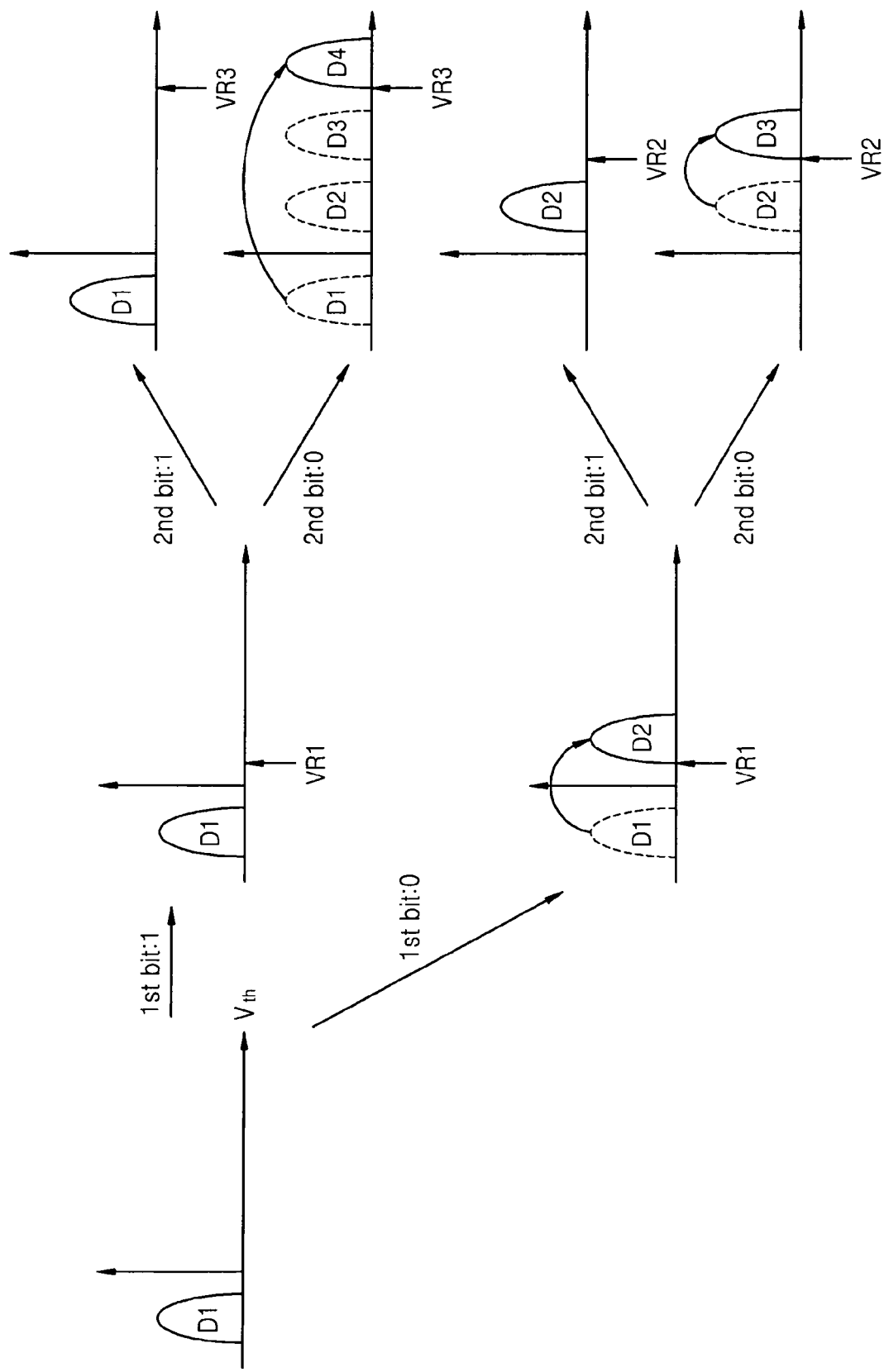
FIG. 2 is a diagram of first and second operations for programming a non-volatile memory cell according to an example embodiment.
Figure 3:
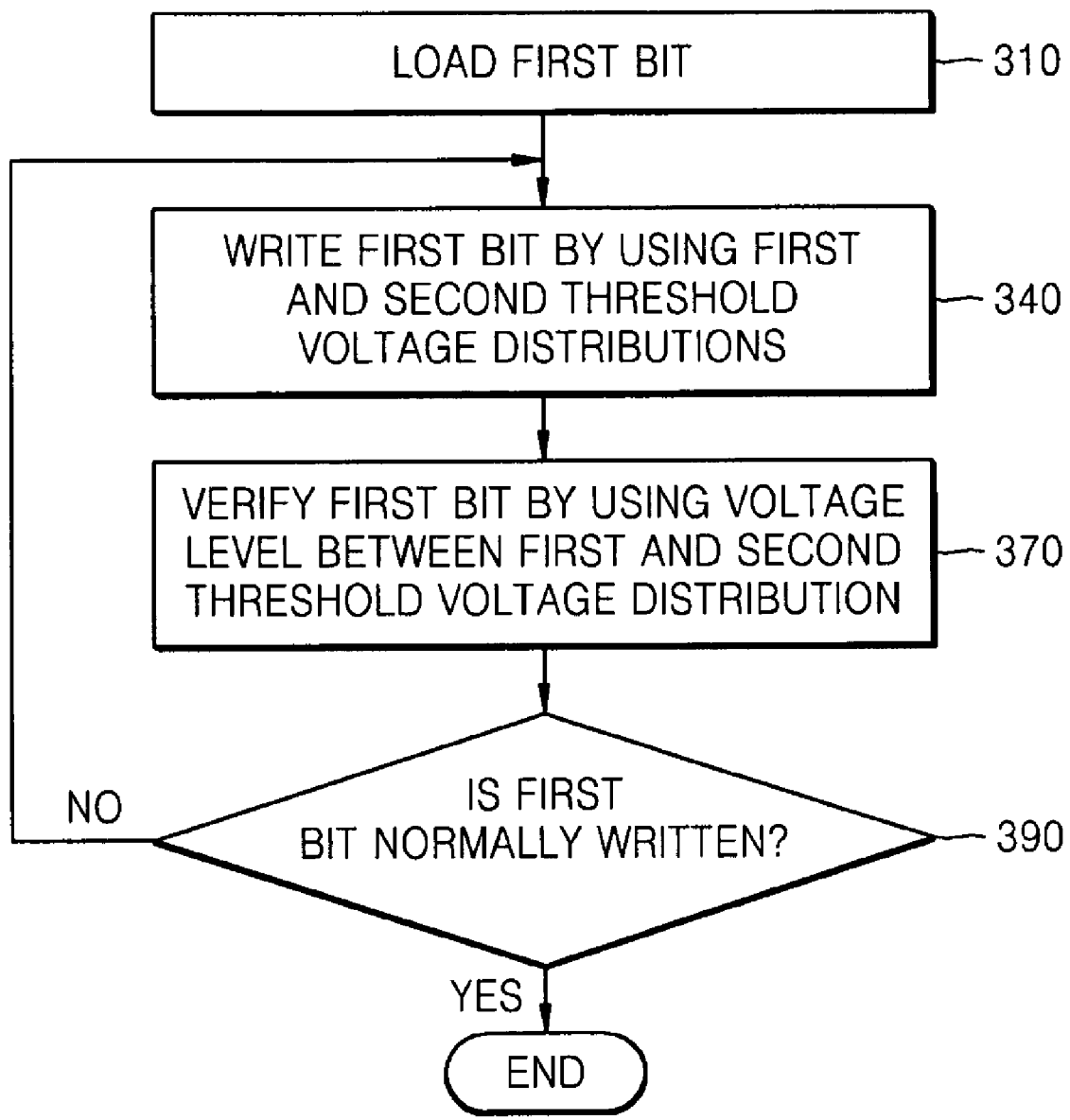
FIG. 3 is a flowchart of an example embodiment of the first operation of FIG. 2.
Figure 4:
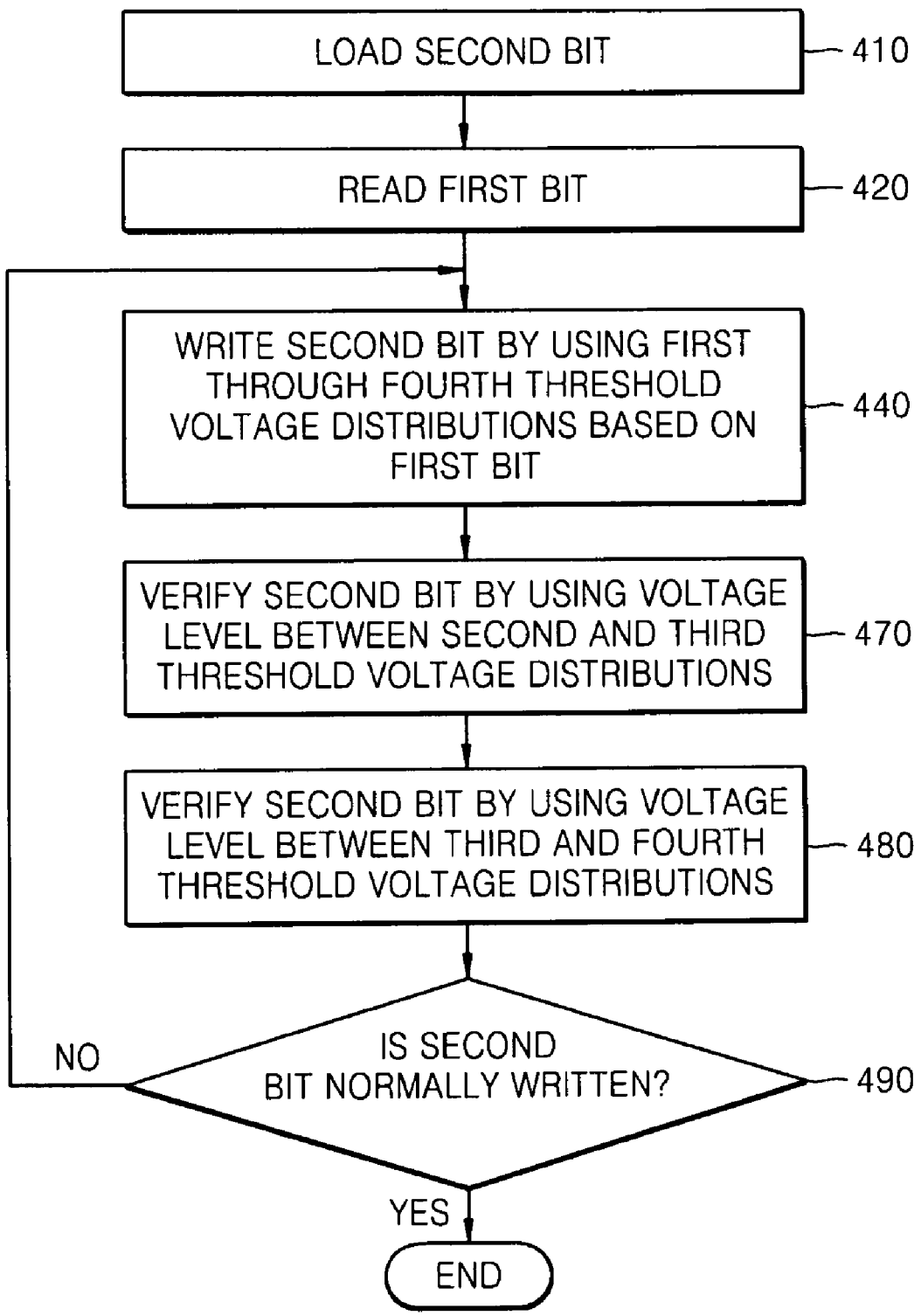
FIG. 4 is a flowchart of an example embodiment of the second operation of FIG. 2.

FIG. 2 is a diagram of the first and second operations, which may program first and second bits, respectively, according to an example embodiment. FIG. 3 is a flowchart of an example embodiment of the first operation of FIG. 2. FIG. 4 is a flowchart of an example embodiment of the second operation of FIG. 2.

Referring to FIGS. 2 and 3, the first bit may be loaded at 310. The first and second threshold voltage distributions D1 and D2 may be used to write the first bit (e.g., the least significant bit) in the non-volatile memory cell at 340. When the first bit is 0, a threshold voltage of the non-volatile memory cell may be programmed or set to a voltage level within the second threshold voltage distribution D2. For example, when the first bit is 0, the threshold voltage may be changed from a voltage level within the first threshold distribution D1 to a voltage level within the second threshold voltage distribution D2. When the first bit is 1, the threshold voltage may be maintained within the first threshold voltage distribution D1.

At 370, whether the first bit has been properly programmed may be determined based on a first verifying voltage VR1. The first verifying voltage VR1 may have a voltage level higher than the first threshold voltage distribution D1, but lower than the second threshold voltage distribution D2. The threshold voltage distribution within which the threshold voltage currently lies may be determined by comparing the threshold voltage with the first verifying voltage VR1. Whether the first bit is properly programmed in the non-volatile memory cell may be determined based on the result of the comparison. For example, when the first bit is 0 and the threshold voltage is higher than the first verifying voltage VR1, the first bit may be considered properly programmed. Alternatively, when the first bit is 0 and the threshold voltage is lower than the first verifying voltage VR1, the first bit may be considered improperly programmed.

When the first bit is improperly programmed at 390, the process may return to 340 and repeat. When the first bit is properly programmed at 390, the second bit may be written in the memory. An example operation for programming the second bit will be discussed in more detail below with regard to FIGS. 2 and 4.

Referring to FIGS. 2 and 4, the second bit may be loaded at 410, and the first bit may be read at 420. At 440, the second bit may be written using the first and fourth threshold voltage distributions D1 and D4 or using the second and third threshold voltage distributions D2 and D3 based on the result of the first operation (e.g., the value of the first bit). In one example, the second bit may be written using the first and fourth threshold voltage distributions D1 and D4, or using the second and third threshold voltage distributions D2 and D3 based on the value of the first bit and the value of the second bit.

For example, if the first bit is 0 (e.g., when the threshold voltage is set to a voltage level within the second threshold voltage distribution D2 during the first operation) and the second bit is 0, the threshold voltage may be set to a voltage level within the third threshold voltage distribution D3 during the second operation. If the first bit is 0 and the second bit is 1, the threshold voltage may be maintained at a voltage level within the second threshold voltage distribution D2 during the second operation.

If the first bit is 1 (e.g., when the threshold voltage is maintained within the first threshold voltage distribution D1 during the first operation) and the second bit is 0, the threshold voltage may be set to a voltage level within the fourth threshold voltage distribution D4 during the second programming operation. If the first bit is 1 (e.g., when the threshold voltage is maintained within the first threshold voltage distribution D1 in the first operation) and the second bit is 1, the threshold voltage may be maintained at a voltage level within the first threshold voltage distribution D1 during the second programming operation.

At 470 and 480, whether the second bit is programmed properly may be verified based on second and third verifying voltages VR2 and VR3. The second verifying voltage VR2 may have a voltage level higher than the second threshold voltage distribution D2, but lower than the third threshold voltage distribution D3. The third verifying voltage VR3 may have a voltage level higher than the third threshold voltage distribution D3, but lower than the fourth threshold voltage distribution D4. Accordingly, the threshold voltage may be compared with the second and third verifying voltages VR2 and VR3 to determine which threshold voltage distribution the threshold voltage is currently within. Whether the second bit is properly programmed in the non-volatile memory cell may be determined based on the result of the comparison. For example, when the first bit is 0, the second bit is 1, and the threshold voltage is lower than the second and third verifying voltages VR2 and VR3, the second bit may be considered properly programmed. Alternatively, when the first bit is 0, the second bit is 1, and the threshold voltage is higher than the second verifying voltage VR2, the second bit may be considered improperly programmed.

When the second bit is determined to be improperly programmed at 490, the process may return to 440 and repeat. When the second bit is determined to be properly programmed at 490, a third bit may be written using a third operation. The third operation will be described in more detail below.

Figure 5:
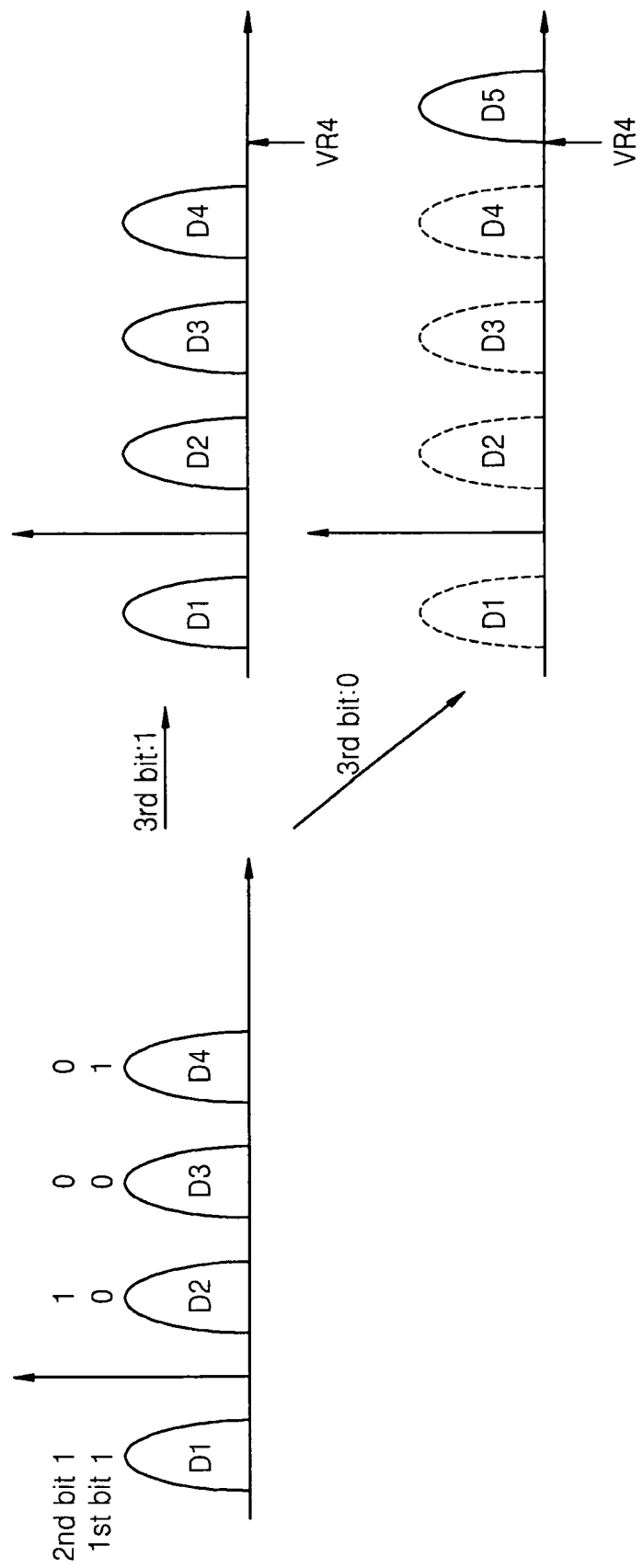
FIG. 5 is a diagram of a third operation for programming a non-volatile memory cell according to an example embodiment.
Figure 6:
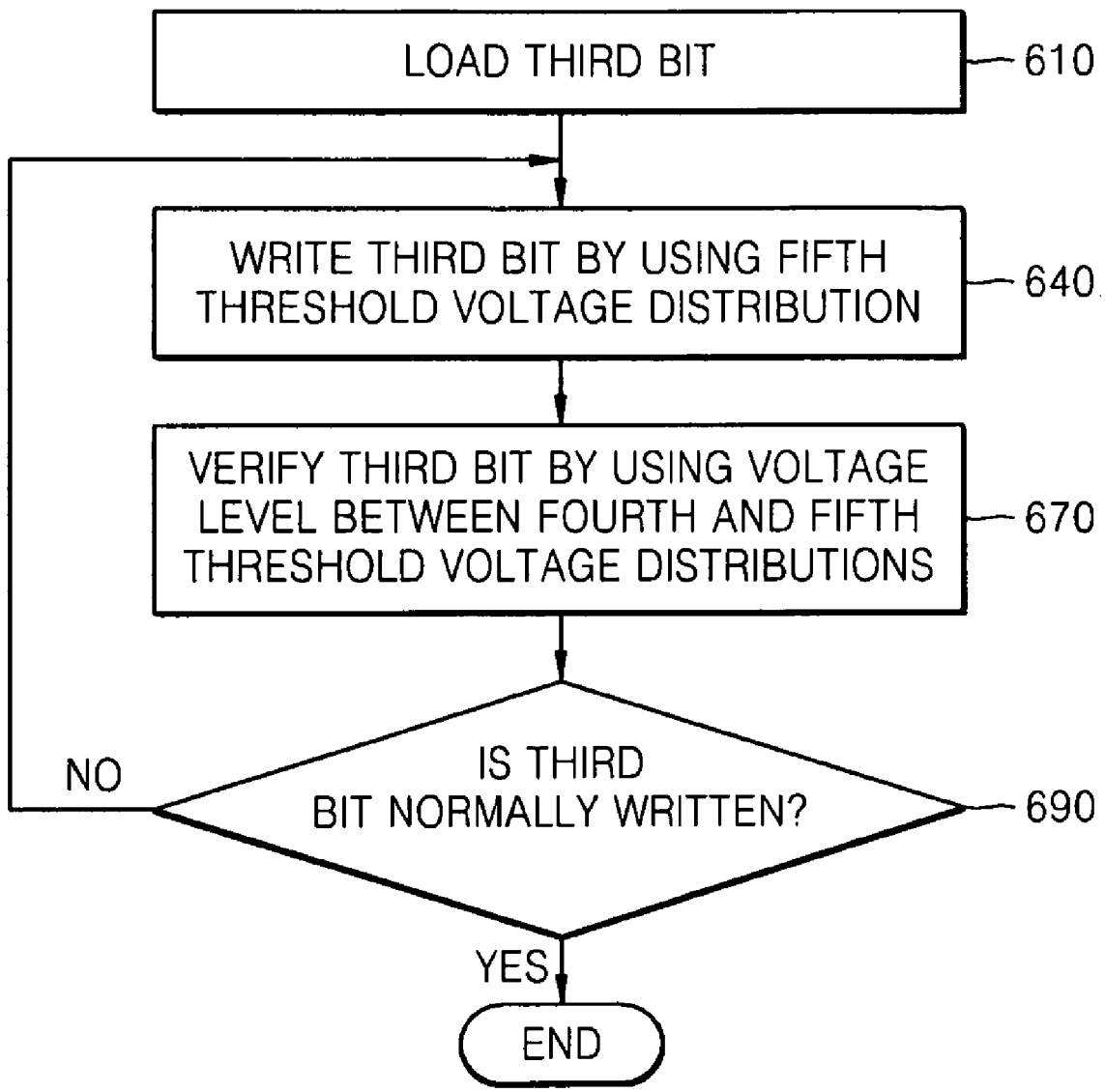
FIG. 6 is a flowchart of an example embodiment of the third operation of FIG. 5.

FIG. 5 is a diagram of the third operation for programming a non-volatile memory cell according to an example embodiment. FIG. 6 is a flowchart of an example embodiment of the third operation of FIG. 5.

Referring to FIGS. 5 and 6, the third bit is loaded at 610. At 640, the threshold voltage of the non-volatile memory cell may be maintained at a current voltage level or set to a voltage level within a fifth threshold voltage distribution D5. If the third bit is 0, the threshold voltage may be programmed to a voltage level within the fifth threshold voltage distribution D5. For example, if the first bit is 1, the second bit is 0, and the third bit is 0, the threshold voltage may be set to the fifth threshold voltage distribution D5.

If the third bit is 1, the threshold voltage may be maintained at the voltage level set during the second operation. For example, if the first bit is 1, the second bit is 0, and the third bit is 1, the threshold voltage may be maintained within the fourth threshold voltage distribution D4.

In this example embodiment, during the third operation, the threshold voltage may be maintained at a voltage level set during the second operation or set to a voltage level within the fifth threshold voltage distribution based on the value of the third bit, but regardless of the value of the first and/or second bits. If maintained, however, the threshold voltage distribution in which the threshold voltage lies after performing the third operation may depend on the values of the first and/or second bits.

According to example embodiments, in the third operation, the threshold voltage may be set to a voltage level within any of the fifth through eighth threshold voltage distributions D5 through D8. However, for the sake of convenience of clarity and brevity, the threshold voltage shown in FIG. 5 is programmed to a voltage level within the fifth threshold voltage distribution D5 in the third operation.

At 670, whether the third bit is properly programmed may be verified based on a fourth verifying voltage VR4. The fourth verifying voltage VR4 may have a voltage level higher than the fourth threshold voltage distribution D4, but lower than the fifth threshold voltage distribution D5. Whether the third bit is properly programmed may be determined by comparing the voltage level of the threshold voltage with the fourth verifying voltage VR4. For example, when the first bit is 1, the second bit is 1, the third bit is 1, and the threshold voltage is lower than the fourth verifying voltage VR4, the third bit may be considered properly programmed. Alternatively, when the first bit is 1, the second bit is 1, the third bit is 1, and the threshold voltage is higher than the fourth verifying voltage VR4, the third bit may be considered improperly programmed.

When the third bit is improperly programmed at 690, the process may return to 640 and repeat. When the third bit is properly programmed at 690, fourth and fifth operations may be performed.

As discussed above, if the third bit of the multi-bit code is 0, the voltage level of the threshold voltage is set to a voltage level within the fifth threshold voltage distribution D5, regardless of the values of the first and second bits. Accordingly, after performing the third operation, the voltage level of the threshold voltage may be within the fifth voltage distribution D5 regardless of whether the first bit is 0 or 1, or the second bit is 0 or 1. The fourth and fifth operations may be used to set the voltage level of the threshold voltage to one of the fifth through eighth threshold voltage distributions D5, D6, D7, and D8, thereby differentiating between multi-bit codes in which the third bit is 0.

As noted above, the fifth, sixth, seventh, and eight threshold voltage distributions D5, D6, D7, and D8 may correspond to the fifth (e.g., 011), sixth (e.g., 010), seventh (e.g., 000), and eighth (e.g., 001) codes, respectively. Accordingly, the fourth and fifth operations may be used to program one of the fifth through eighth multi-bit codes in the non-volatile memory cell.

Figure 7:
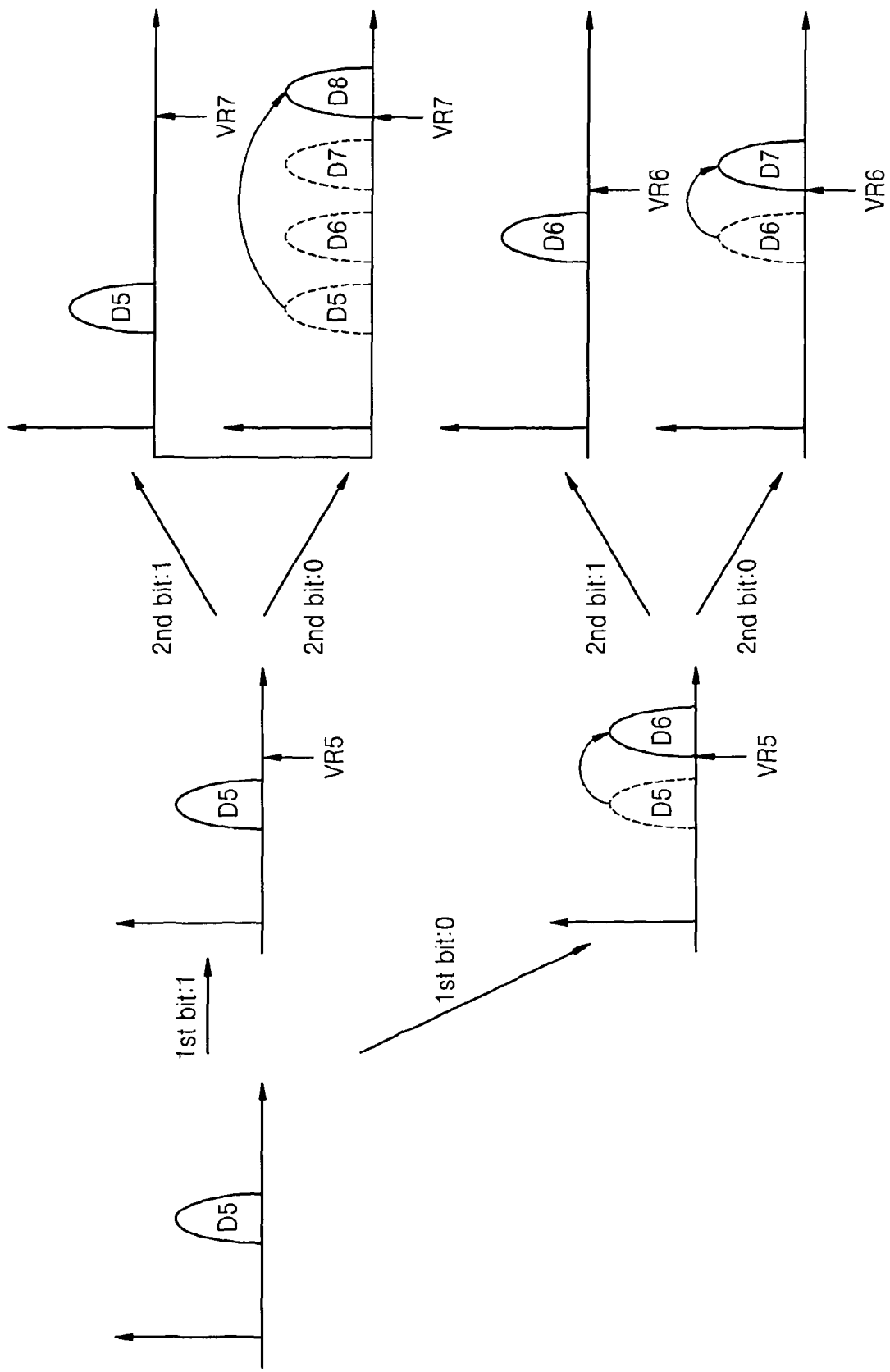
FIG. 7 is a diagram of fourth and fifth operations for programming a non-volatile memory cell according to an example embodiment.

FIG. 7 is a diagram of the fourth and fifth operations for programming a non-volatile memory cell according to an example embodiment.

In the fourth and fifth operations, the first and second bits may be programmed again (or re-programmed) using the fifth through eighth threshold voltage distributions D5 through D8. The fourth and fifth operations may be similar or substantially similar operations to the first and second operations. Referring to FIGS. 2 and 7, the first and second operations and the fourth and fifth operations may be similar or substantially similar operations, except that the first and second operations may use the first through fourth threshold voltage distributions D1 through D4, whereas the fourth and fifth operations may use the fifth through eighth threshold voltage distributions D5 through D8.

Figure 8:
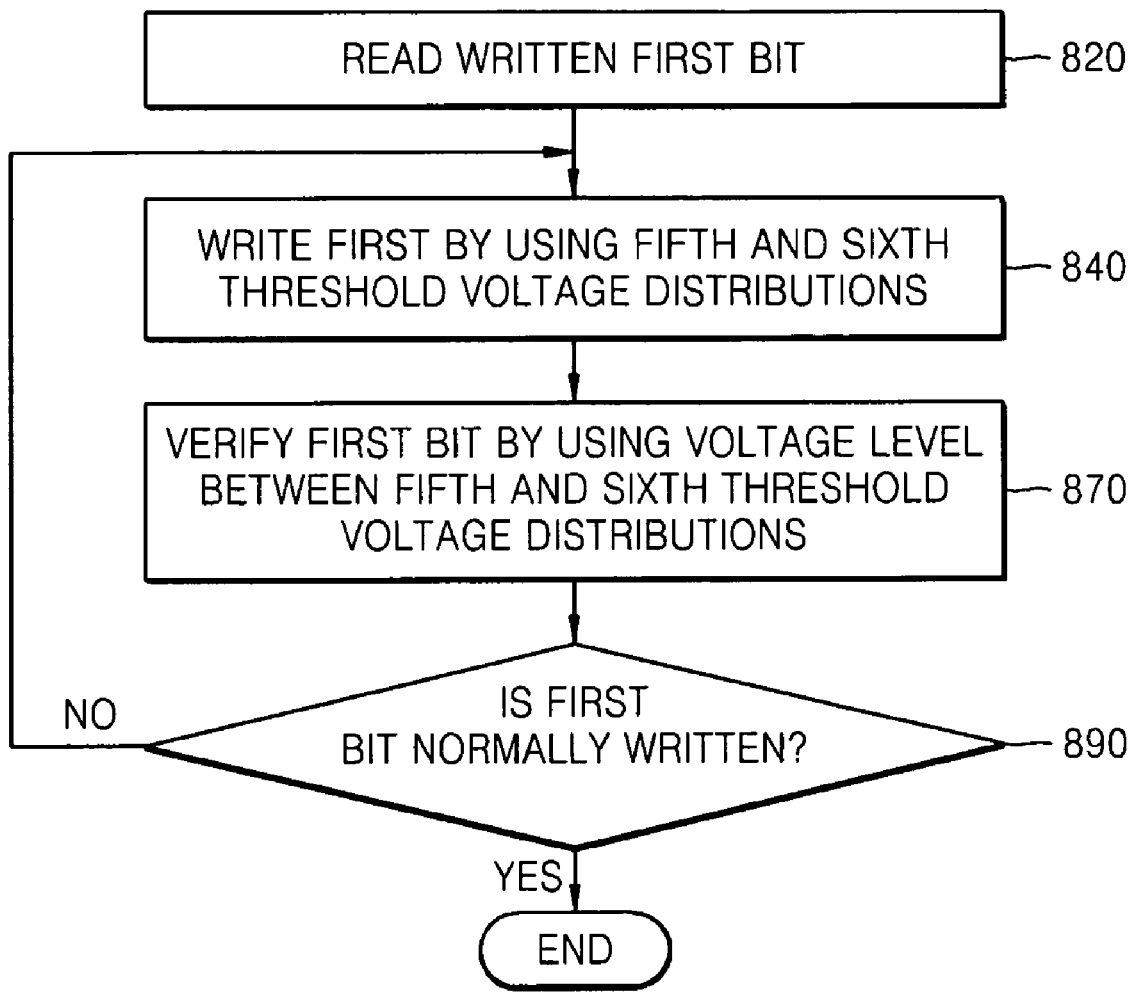
FIG. 8 is a flowchart of an example embodiment of the fourth operation of FIG. 7.
Figure 9:
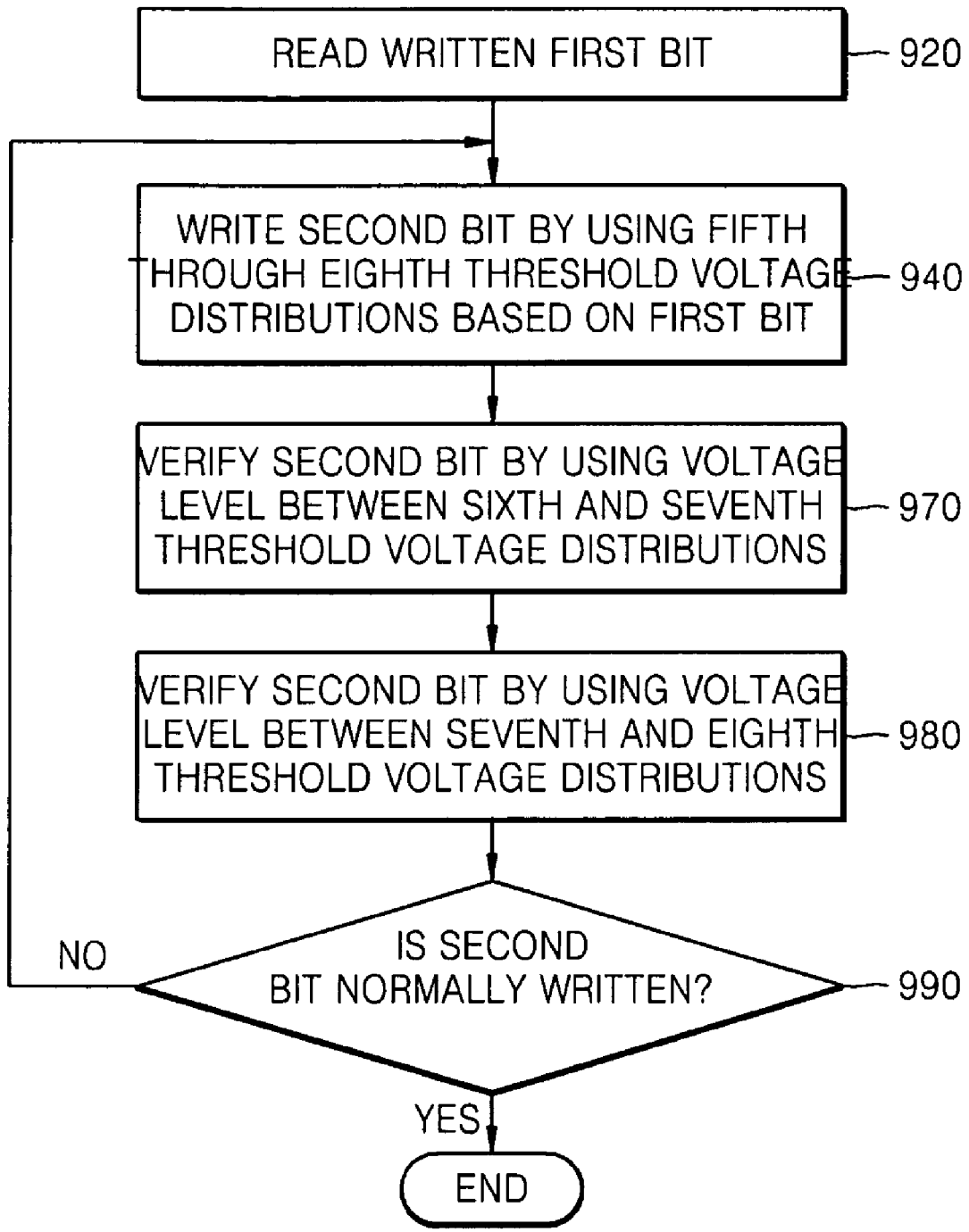
FIG. 9 is a flowchart of an example embodiment of the fifth operation of FIG. 7.

FIG. 8 is a flowchart of an example embodiment of the fourth operation of FIG. 7. FIG. 9 is a flowchart of an example embodiment of the fifth operation of FIG. 7.

Referring to FIGS. 7 and 8, in the fourth operation, the first bit written during the first operation may be read at 820. At 840, the first bit may be written using the fifth and sixth threshold voltage distributions D5 and D6. For example, if the first bit is 0, a threshold voltage of the non-volatile memory cell may be set to a voltage level within the sixth threshold voltage distribution D6. When the first bit is 1, the threshold voltage may be maintained within the fifth threshold voltage distribution D5. In FIG. 8, the operation performed at 840 may be similar or substantially similar to 340 of the first operation in FIG. 3, except that the voltage level of the respective threshold voltage distributions may differ.

At 870, whether the first bit is properly programmed may be verified based on a fifth verifying voltage VR5. The fifth verifying voltage VR5 may have a voltage level higher than the fifth threshold voltage distribution D5, but lower than the sixth threshold voltage distribution D6. The threshold voltage may be compared with the fifth verifying voltage VR5 to determine the threshold voltage distribution within which the threshold voltage lies. Based on the result of comparison, whether the first bit is properly programmed in the non-volatile memory cell may be determined.

In FIG. 8, the operation performed at 870 may be similar or substantially similar to 370 in FIG. 3, except that the voltage level of the respective verifying voltages and threshold voltage distributions may differ.

If the first bit is determined to be improperly programmed at 890, the process may return to 840 and repeat. If the first bit is determined to be properly programmed at 890, a fifth operation may be performed.

Referring to FIGS. 7 and 9, in the fifth operation, the first bit written during the fourth operation may be read at 920. At 940, the second bit may be written by using the fifth and eighth threshold voltage distributions D5 and D8 or the sixth and seventh threshold voltage distributions D6 and D7 based on the result of programming in the fourth programming operation (e.g., the value of the first bit written during the fourth operation). For example, if the first bit is 0 (e.g., when the voltage threshold is set within the sixth threshold voltage distribution D6 in the fourth programming operation) and the second bit is 0, the threshold voltage may be set to a voltage level within the seventh threshold voltage distribution D7 during the fifth operation. If the first bit is 0 and the second bit is 1, the threshold voltage may be maintained within the sixth threshold voltage distribution D6 during the fifth programming operation.

If the first bit is 1 (e.g., when the threshold voltage is maintained within the fifth threshold voltage distribution D5 in the fourth programming operation) and the second bit is 0, the threshold voltage may be set to a voltage level within the eighth threshold voltage distribution D8 during the fifth programming operation. If the first bit is 1 and the second bit is 1, the threshold voltage may be maintained within the fifth threshold voltage distribution D5 during the fifth programming operation.

In FIG. 9, the operation performed at 940 may be similar or substantially similar to the operation performed at 440 in FIG. 4, except that the voltage level of the respective threshold voltage distributions may differ.

At 970 and 980, whether the second bit is properly programmed may be verified based on sixth and seventh verifying voltages VR6 and VR7. The sixth verifying voltage VR6 may have a voltage level higher than the sixth threshold voltage distribution D6, but lower than the seventh threshold voltage distribution D7. The seventh verifying voltage VR7 may have a voltage level higher than the seventh threshold voltage distribution D7, but lower than the eighth threshold voltage distribution D8.

The threshold voltage may be compared to the sixth and seventh verifying voltages VR6 and VR7 to determine the threshold voltage distribution in which the threshold voltage lies. Based on the result of the comparison, whether the second bit is properly programmed in the non-volatile memory cell may be determined.

In FIG. 9, operations performed at 970 and 980 may be similar or substantially similar to operations performed at 470 and 480 in FIG. 4, respectively, except that, the voltage levels of the respective verifying voltages and threshold voltage distributions may differ.

When the second bit is improperly programmed at 990, the process may return to 940 and repeat.

The fourth and fifth operations may be performed in a manner similar or substantially similar to the first and second operations, except that the voltage levels of the respective threshold voltage distributions and the respective verifying voltages may differ. Accordingly, the process of writing the first and second bits used in the first and second operations may be used in the fourth and fifth operations.

When the threshold voltage is maintained in the third operation, the fourth and fifth operations may not be performed (e.g., may be omitted). The fourth and fifth operations may be performed when the threshold voltage is set to a voltage level within the fifth threshold voltage distribution D5 in the third operation. For example, the fourth and fifth operations may be performed when the threshold voltage changes during the third programming operation, or for example, when the third bit is 0. Otherwise, the threshold voltage programmed in the first through third operations may not change because the fourth and fifth operations are not performed.

The values of the first and second bits used in the fourth and fifth operations may be obtained via an internal reading process. For example, the values of the first and second bits may be obtained by determining which threshold voltage distribution the threshold voltage was programmed within during the first and second programming operations.

The threshold voltage distribution in which the threshold voltage of the non-volatile memory cell lies may change when a bit of data is 0, and the threshold voltage distribution may be maintained when the data bit is 1. However, according to at least one other example embodiment, the threshold voltage distribution may change when the bit value is 1, but may be maintained when the bit value is 0. For example, in the fourth operation illustrated in FIG. 7, if the first bit is 1, the threshold voltage may be programmed to a voltage level within the sixth threshold voltage distribution D6, but if the first bit is 0, the threshold voltage may be maintained within the fifth threshold voltage distribution D5.

The fourth operation may use the fifth and sixth threshold voltage distributions D5 and D6. The fifth operation may use the fifth and eighth threshold voltage distributions D5 and D8 or the sixth and seventh threshold voltage distributions D6 and D7, as shown in FIG. 7.

Alternatively, the fourth operation may use the fifth and sixth threshold voltage distributions D5 and D6, and the fifth operation may use the fifth and seventh threshold voltage distributions D5 and D7 or the sixth and eighth threshold voltage distributions D6 and D8. For example, the fourth operation may program the threshold voltage to a voltage level within the fifth or sixth threshold voltage distribution D5 or D6 based on the value of the first bit. In the fifth operation, when the threshold voltage is programmed to a voltage level within the fifth threshold voltage distribution D5 in the fourth operation, the threshold voltage may be programmed to a voltage level within the fifth or seventh threshold voltage distribution D5 or D7 based on the value of the second bit. Alternatively, when the threshold voltage is programmed to a voltage level within the sixth threshold voltage distribution D6 in the fourth operation, the threshold voltage may be programmed to a voltage level within the sixth or eighth threshold voltage distribution D6 or D8 based on the value of the second bit in the fifth operation.

In another example embodiment, the fourth operation may use the fifth and seventh threshold voltage distributions D5 and D7, and the fifth operation may use the fifth and sixth threshold voltage distributions D5 and D6 or the seventh and eighth threshold voltage distributions D7 and D8. Moreover, the fourth and fifth operations may be performed by using other various programming methods. The same may apply for the first and second operations.

When a threshold voltage distribution used in each operation changes, mapping relationships of written data and codes illustrated in FIG. 1B may also change.

Additionally, while the fourth and fifth operations may use the same or substantially the same programming methods as the first and second operations, the programming methods used in the fourth and fifth operations and the first and second operations may differ. For example, the first operation may use the first and second threshold voltage distributions D1 and D2, while the fourth operation uses the fifth and seventh threshold voltage distributions D5 and D7 instead of the fifth and sixth threshold voltage distributions D5 and D6.

Figures 10A, 10B:
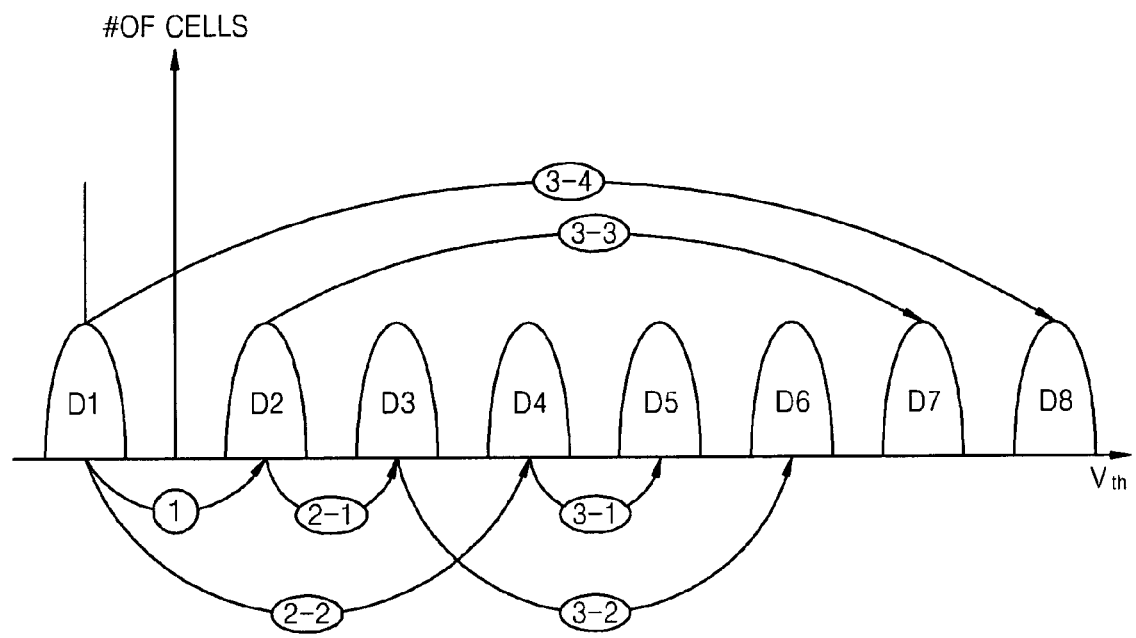
FIG. 10A is a diagram of a comparative method of programming a non-volatile memory cell to be compared to example embodiments.
FIG. 10B is a chart illustrating comparative codes used in the comparative method to be compared to example embodiments.

FIG. 10A is a diagram of a comparative method of programming a non-volatile memory cell to be compared to example embodiments.

FIG. 10B is a chart illustrating comparative codes used in the comparative method to be compared to example embodiments.

Figure 11:
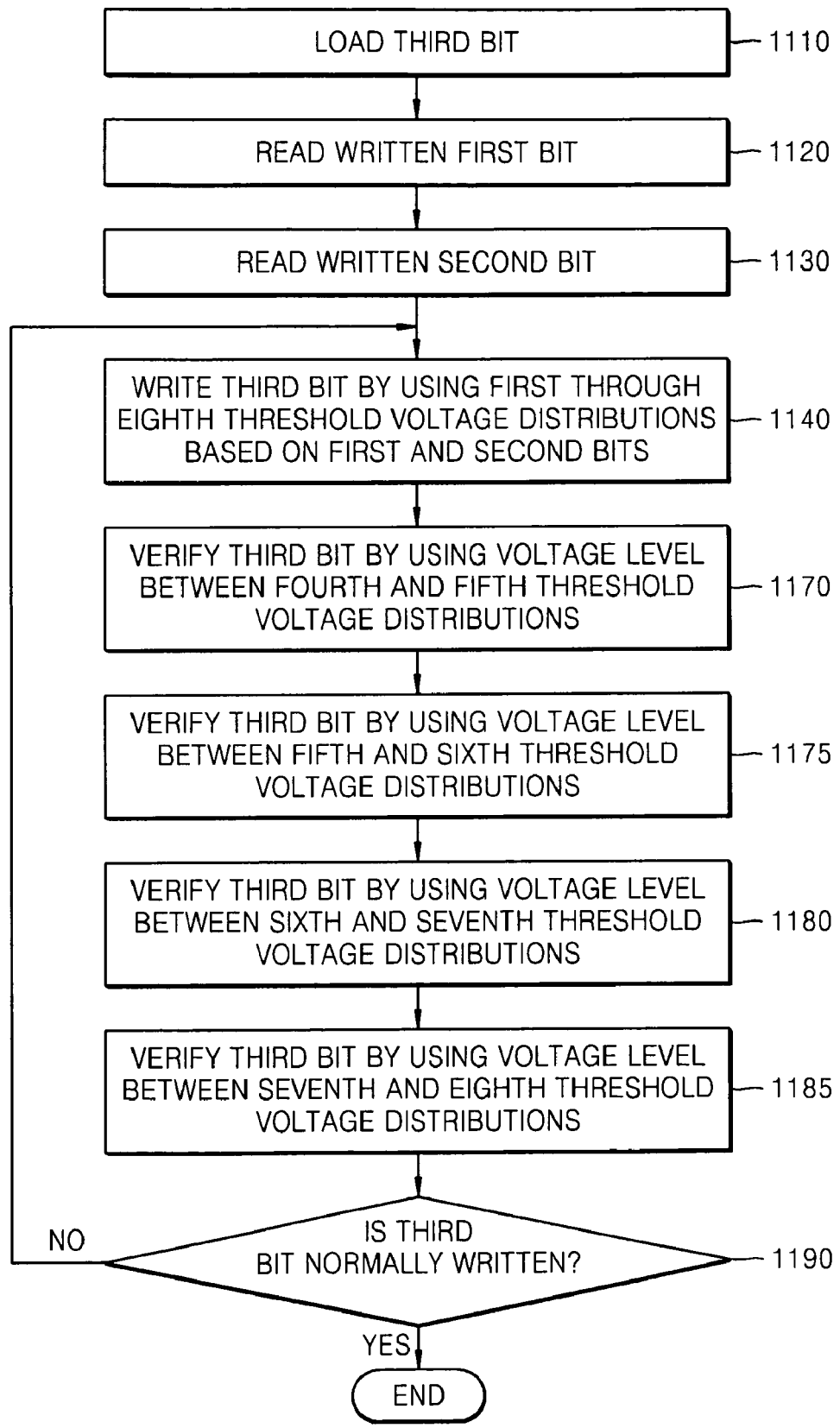
FIG. 11 is a flowchart illustrating an operation of programming a third bit according to the comparative method of FIG. 10A.

FIG. 11 is a flowchart illustrating an operation of programming a third bit according to FIG. 10A.

Referring to FIGS. 10A, 10B, and 11, in the comparative method, the operation of programming the third bit and operations of programming first and second bits are different. Accordingly, in order to use the comparative method, two kinds or types of programming operations are performed.

However, as opposed to the comparative method, in at least some example embodiments, the 2-bit writing process used in the first and second operations may also be used in the fourth and fifth operations. Accordingly, one programming operation may be repeated or repeatedly performed.

Additionally, referring to FIG. 11, the comparative method requires four continuous verifications in order to write a third bit. However, referring to FIGS. 6, 8, and 9, continuous verifications performed in the example embodiments may be no more than 2.

In contrast to the comparative method, at least some example embodiments may program data of at least 3 bits by using a 2-bit programming operation. Therefore, a complex programming operation may not be required to program data of at least 3 bits.

While example embodiments have been particularly shown and described with reference to the example embodiments shown, it will be understood by those of ordinary skill in the art that various changes in form and details may be made therein without departing from the spirit and scope of the present invention as defined by the following claims.

What is claimed is:

1. A method of programming a non-volatile memory cell comprising:
    programming a first bit of multi-bit data according to a value of the first bit, the first bit is programmed by using a first of a plurality of threshold voltage distributions;
    programming a second bit of the multi-bit data according to a value of the second bit based on the first of the plurality of threshold distributions, the second bit is programmed by using a second of the plurality of threshold voltage distributions; and
    programming a third bit of the multi-bit data according to a value of the third bit based on the second of the plurality of threshold voltage distributions, the third bit is programmed by using the second of the plurality of threshold voltage distributions of the programmed first and second bits if the third bit is a first value.

2. The method of claim 1, wherein the third bit is programmed by using a third of the plurality of threshold voltage distributions caused by a method of the programming the first and second bits if the third bit is the second value.

3. The method of claim 2, when the third bit is the second value, the method further comprising:
    re-programming the first bit by using a fourth of the plurality of threshold voltage distributions based on the value of the programmed third bit, and
    re-programming the second bit by using a fifth of the plurality of threshold voltage distributions based on the value of the re-programmed first bit.

4. The method of claim 1, wherein programming the first bit of the multi-bit data comprises:
    setting a threshold voltage of the non-volatile memory cell to a first voltage level, the first voltage level being the first of the plurality of threshold voltage distributions.

5. The method of claim 4, wherein programming the second bit of the multi-bit data comprises:
    setting a threshold voltage of the non-volatile memory cell to a second voltage level according to the value of the second bit, the second voltage level being the same as the first voltage level if the second bit is the first value, and the second voltage level being within the second of the plurality of threshold voltage distributions if the second bit is a second value.

6. A method of programming a non-volatile memory cell where the non-volatile memory cell is programmed to have a predetermined threshold voltage, the method comprising:
    first and second programming operations, which programs a threshold voltage of the non-volatile memory to belong to one threshold voltage distribution from among first through fourth threshold voltage distributions, according to values of first and second bits of data that is to be programmed; and
    a third programming operation, which maintains the threshold voltage according to the first and second bits or programs the threshold voltage to belong to a pre-determined threshold voltage distribution from among fifth through eighth threshold voltage distributions, according to a value of a third bit of the data.

7. The method of claim 6, further comprising:
    fourth and fifth programming operations, which programs the threshold voltage to belong to one threshold voltage distribution from among the fifth through eighth threshold voltage distributions, according to the values of the first and second bits.

8. The method of claim 7, wherein locations of the threshold voltage distributions to which the threshold voltage belongs to the fourth and fifth programming operations are respectively symmetrical to locations of the threshold voltage distributions to which the threshold voltage belongs to the first and second programming operations.

9. The method of claim 7, wherein when the threshold voltage is maintained in the third programming operation, the fourth and fifth programming operations are not performed.

10. The method of claim 7, wherein the predetermined threshold voltage distribution in the third programming operation is the fifth threshold voltage distribution.

11. The method of claim 7, further comprising:
    after the third programming operation, an internal reading operation which reads the values of the first and second bits used in the fourth and fifth programming operations from the non-volatile memory cell.

12. The method of claim 11, wherein the internal reading operation is performed when the threshold voltage is programmed to belong to the pre-determined threshold voltage distribution in the third programming operation.

13. The method of claim 7, further comprising:
    after the third programming operation, an operation of verifying the value of the third bit written in the non-volatile memory cell, based on a verifying voltage having a higher voltage level than the first through fourth threshold voltage distributions and a lower voltage level than the fifth through eighth threshold voltage distributions.

14. The method of claim 7, wherein the fourth and fifth programming operations comprise:
- a fourth programming operation, which programs the threshold voltage to belong to one threshold voltage distribution from among the fifth and sixth threshold voltage distributions, according to the value of the first bit; and
- a fifth programming operation, which programs the threshold voltage to belong to one threshold voltage distribution from among the fifth through eighth threshold voltage distributions, according to the threshold voltage distribution programmed in the fourth programming operation and the value of the second bit.

15. The method of claim 14, wherein the fifth programming operation programs the threshold voltage to belong to the fifth threshold voltage distribution or the eighth threshold voltage distribution when the threshold voltage programmed in the fourth programming operation belongs to the fifth threshold voltage distribution, and programs the threshold voltage to belong to the sixth threshold voltage distribution of the seventh threshold voltage distribution when the threshold voltage programmed in the fourth programming operation belongs to the sixth threshold voltage distribution.

16. The method of claim 14, further comprising:
- after the fourth programming operation, an operation of verifying the non-volatile memory cell based on a verifying voltage having a higher voltage level than the fifth threshold voltage distribution and a lower voltage level than the sixth through eighth threshold voltage distributions.

17. The method of claim 16, further comprising, after the fifth programming operation:
- an operation of verifying the non-volatile memory cell based on a verifying voltage having a higher voltage level than the sixth threshold voltage distribution and a lower voltage level than the seventh through eighth threshold voltage distribution; and
- an operation of verifying the non-volatile memory cell based on a verifying voltage having a higher voltage level than the seventh threshold voltage distribution and a lower voltage level than the eighth threshold voltage distribution.

18. The method of claim 6, further comprising:
- an operation of receiving and loading the third bit, wherein the third programming operation programs the loaded third bit.

19. A method of mapping a code, the method comprising:
- mapping codes in a plurality of threshold voltage distributions to which a threshold voltage of a non-volatile memory cell can belong, wherein first bits and second bits of first through fourth codes respectively indicating first through fourth threshold voltage distributions are respectively identical to first bits and second bits of fifth through eighth codes respectively indicating fifth through eighth threshold voltage distributions, and third bits of the first through fourth codes are different from third bits of the fifth through eighth codes.

20. The method of claim 19, wherein the third bits of the first through fourth codes are the same, and the third bits of the fifth through eighth codes are the same.

* * * * *